United States Patent
Partsch et al.

(10) Patent No.: US 7,079,441 B1
(45) Date of Patent: Jul. 18, 2006

(54) METHODS AND APPARATUS FOR IMPLEMENTING A POWER DOWN IN A MEMORY DEVICE

(75) Inventors: Torsten Partsch, Raleigh, NC (US); David Ma, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/049,857

(22) Filed: Feb. 4, 2005

(51) Int. Cl.
*G11C 7/00* (2006.01)
(52) U.S. Cl. .................. 365/226; 365/227; 365/228
(58) Field of Classification Search .............. 365/226, 365/227, 228
See application file for complete search history.

(56) References Cited

U.S. PATENT DOCUMENTS

| | | | |
|---|---|---|---|
| 5,905,688 A * | 5/1999 | Park ........................ | 365/227 |
| 6,744,687 B1 * | 6/2004 | Koo et al. ................ | 365/226 |

\* cited by examiner

*Primary Examiner*—Tuan T. Nguyen
*Assistant Examiner*—N Nguyen
(74) *Attorney, Agent, or Firm*—Edell, Shapiro & Finnan, LLC

(57) ABSTRACT

A power down is implemented in a memory device capable of performing a read operation in which data and a data strobe signal are supplied as outputs. The power down techniques includes generating a first signal for preventing the data from being supplied as an output of the memory device, generating a second signal for causing the data strobe signal to remain in a predetermined state, and generating a third signal for preventing the data strobe signal in the predetermined state from being supplied as an output of the memory device.

26 Claims, 7 Drawing Sheets

METHODS AND APPARATUS FOR IMPLEMENTING A POWER DOWN IN A MEMORY DEVICE

BACKGROUND OF THE INVENTION

1. Field of the Invention

The present invention relates to methods and apparatus for implementing a power down in a memory device and, more particularly to techniques that avoid potential complications resulting from implementing a power down that occurs during a read burst on a dynamic random access memory.

2. Description of the Related Art

In electronic memory devices, such as dynamic random access memories (DRAMs), it is often desirable to conserve power. For example, conventional DRAM chips are capable of entering a power down state when commanded by an external signal. To save additional power, some DRAM chips also suspend clock signals during a power down, which is particularly advantageous in devices that operate on battery power, such as mobile devices. Normally, a memory device such as a DRAM is commanded to enter a power down state while the memory device is not actively reading or writing data, since implementing a power down during a read or write operation can result in malfunction of the memory device.

One such memory device is a double data rate synchronous dynamic random access memory (DDR SDRAM), which is capable of reading out stored data in read bursts. With each read command, a read burst operation sequentially transmits a given number of data words from the memory device to the system in which the memory device is operating. A DDR SDRAM chip facilitates data transfers on both edges of each successive clock cycle (i.e., both the rising and falling edges), thereby doubling the memory chip data throughput. The data, conventionally denoted as "DQ," is driven off the chip via off-chip drivers (OCD) aligned to the rising and falling edges of data strobe signals (DQS), which are also driven off the chip. The length of a read burst is programmable such that, for example, during a read burst of length four, there are four data words driven off the chip during two clocking cycles (i.e., two data words are respectively driven off during the two high phases and two during the two low phases). The signal edges of the DQS signal are used by other devices receiving the data DQ over a set of lines (e.g., a data bus) to latch the DQ data words. Each data word consists of a set of parallel bits simultaneously driven off the chip onto respective lines by a set of respective parallel OCDs in accordance with the configuration of the DDR SDRAM (e.g., sixteen bit word driven by sixteen OCDs).

As with other types of DRAMs, a typical DDR SDRAM chip can enter a "power down" state if the system in which it operates is currently not using the DDR SDRAM chip. This power down state can be entered, for example, by the system pulling the clock enable signal (CKE) sent to the DDR SDRAM chip to a low state (the CKE signal is typically in a high state during normal operation). During "power down" the DDR SDRAM chip retains only that information that is currently stored. Accordingly, power consumption of a DDR SDRAM chip is minimized, thus reducing the drain on a battery (e.g., in a mobile device). A power down can legally be entered into only when no read burst is currently active; otherwise, the power down is considered "illegal" and may result in undesirable consequences such as lost data, bus contention, or system contamination, for example.

However, some systems are not able to determine whether a DDR SDRAM is still in a read burst state when the system attempts to send the DDR SDRAM into a power down state. To avoid "hanging up" the system, DDR SDRAMs must screen out the read burst if a power down command is received and the DDR SDRAM illegally enters the power down state during a read burst.

Systems using DDR SDRAM chips are especially sensitive to the DQS line being stuck in the logical high state, since the signal edges of the DQS signals are used to latch the DQ information. If the DQS signal gets "stuck at high," the DQS OCD continues to drive the line to which it is connected, rather than returning to a non-driving, high impedance state (the "tristate") during the power down. Under such conditions, if the lines onto which the OCDs drive the DQ data words are also used for writing data into the memory device or are used by other memory devices for reading or writing data, conflicting signals may be present on the lines at once. For example, if another device attempts to drive the DQS line to a logic low state to introduce a new clock transition edge into the system to provide a timing reference for data, the attempt to drive the line may be unsuccessful or timing violations may result due to contention with the DQS signal that is stuck at high.

Disabling a DQS OCD during a signal transition (i.e., the strobe signal transitioning from high to low or from low to high) is also undesirable, since this non-monotonous signal may potentially contaminate the system with several unwanted effects such as ringing, intersymbol interference, etc. Accordingly, it would be desirable to address situations in which a memory device receives a power down signal during a read burst operation such that malfunctions are avoided.

SUMMARY OF THE INVENTION

In accordance with one aspect of the invention, there is provided a method of implementing a power down in a memory device capable of performing a read operation in which outputs of the memory device include data and a data strobe signal. The data strobe signal oscillates between first and second states during the read operation in accordance with the timing of the data. The method includes: generating a first signal for preventing the data from being supplied as an output of the memory device; generating a second signal for causing the data strobe signal to remain in a predetermined state; and generating a third signal for preventing the data strobe signal in the predetermined state from being supplied as an output of the memory device. The second signal is preferably delayed relative to the first signal, and the third signal is preferably delayed relative to the second signal such that the data strobe signal is in the predetermined state when the third signal is generated. The first, second, and third signals are generated in response to a power down command signal and can essentially be versions of the power down command signal, with at least the second and third signals being delayed versions of the power down command signal. The first, second, and third signals essentially terminate a read burst operation in three sequential stages in a manner that prevents malfunctions from occurring as a result of an illegal power down (i.e., one that is commanded during an ongoing read burst operation). Optionally, the power down can include suspension of the external clock signal supplied to the memory device.

In accordance with another aspect of the present invention, there is provided a method for terminating a read burst operation in a memory device, wherein outputs of the memory device include data and a data strobe signal. The method includes: disabling an operation of supplying the data as an output of the memory device; causing the data strobe signal to remain in a predetermined state; and disabling an operation of supplying the data strobe signal in the predetermined state as an output of the memory device. These three operations can be performed as three sequential stages with each operation being carried out after the preceding operation has been completed. The first stage can include disabling a plurality of data off-chip drivers that provide the data as an output of the memory device. The third stage can include disabling at least one data strobe off-chip driver that provides the data strobe signal as an output of the memory device. The read burst termination can be performed, for example, in response to a power down command signal, which optionally can include suspension of an external clock supplied to the memory device.

In accordance with yet another aspect of the present invention, there is provided a memory device capable of implementing a power down operation and capable of performing a read operation in which outputs of the memory device include data and a data strobe signal. The memory device includes: a plurality of data off-chip drivers operable to supply the data as an output of the memory device, wherein the data off-chip drivers are disabled in response to a power down command; a strobe generator module operable to generate the data strobe signal, wherein the strobe generator module causes the data strobe signal to remain in a predetermined state in response to the power down command; and at least one data strobe off-chip driver operable to supply the data strobe signal as an output of the memory device, wherein, in response to the power down command, the data strobe off-chip driver is disabled after the strobe generator module causes the data strobe signal to remain in the predetermined state.

The memory device can further include: a data control module operable to supply the data to the plurality of data off-chip drivers; and a data enable module operable to selectively enable and disable the plurality of data off-chip drivers, wherein the data control module and data enable module are reset in response to the power down command. Additionally, a connection for supplying the data strobe signal from the data strobe signal generator to the at least one data strobe off-chip driver can be forced to the predetermined state in response to a signal delayed by a predetermined first delay (denoted as delay2 herein) relative to the power down command, and a data strobe enable module that enables/disables the data strobe off-chip driver can be reset in response to a signal delayed by a second predetermined delay (denoted as delay1 herein) relative to the power down command, wherein the second predetermined delay is greater than the first predetermined delay. The memory device can be, for example, a dynamic random access memory (DRAM) device, such as a double data rate (DDR) synchronous DRAM (SDRAM).

The above and still further objects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DESCRIPTION OF THE PREFERRED EMBODIMENTS

Figure 1:
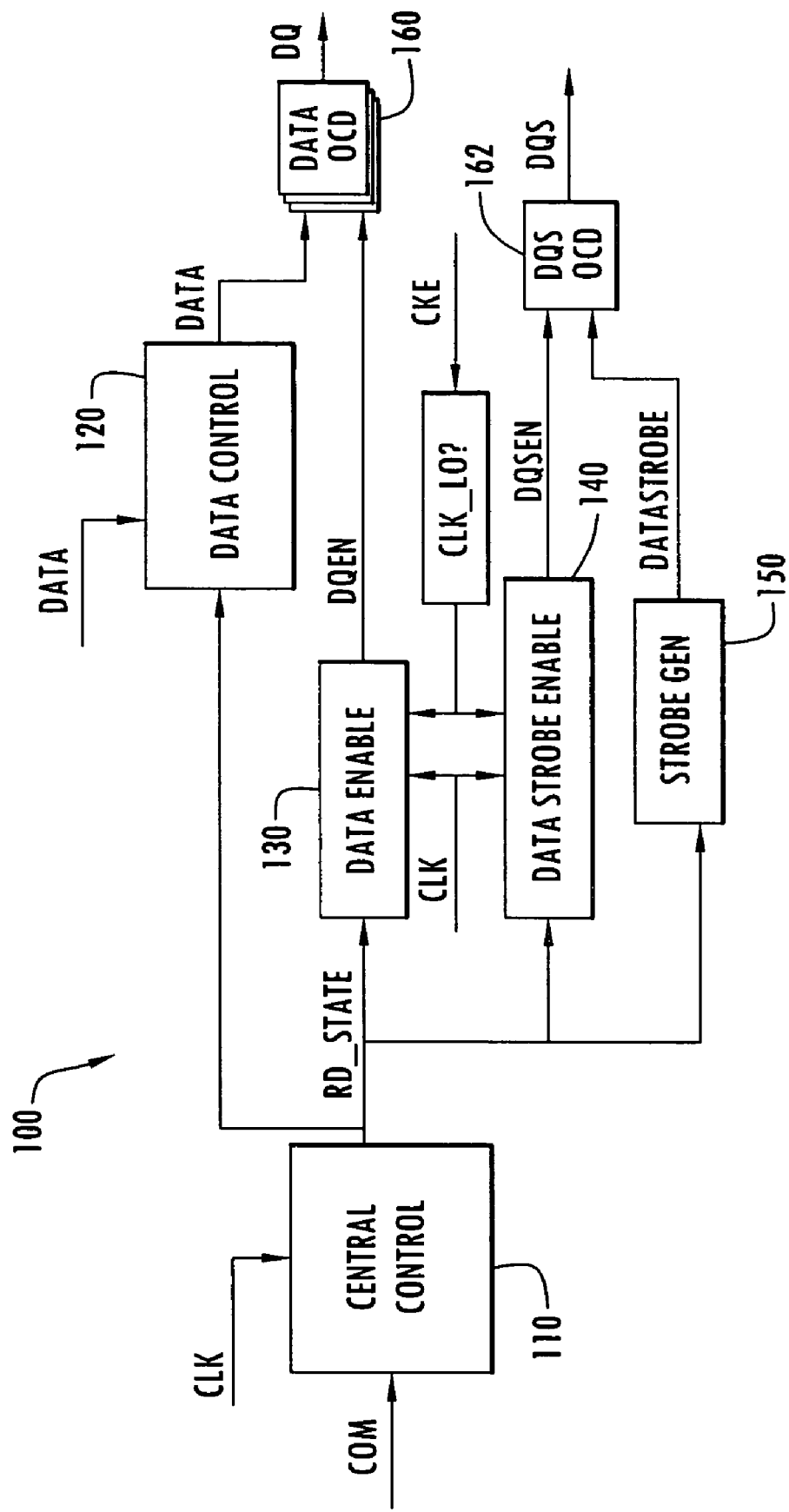
FIG. 1 is a block diagram of the read output section of a DDR SDRAM that implements a power down in a conventional manner.

To better illustrate the invention, read burst and power down operations in a typical memory device will be described in connection with FIGS. 1–4 for contrast. More specifically, a block diagram of the read output section of a memory device 100 capable of implementing a power down read disable is shown in FIG. 1. Memory device 100 can be, for example, a DDR SDRAM chip capable of driving data off the chip at a double data rate (i.e., on both the rising and falling edges of a clock signal).

Included in memory device 100 is a central control module 110 which receives an external command signal (COM) and a clock signal (CLK). Central control module 110 supplies a read state signal (RD_STATE) to a data control module 120, a data enable module 130, a data strobe enable module 140, and a strobe generator block 150. A set of off-chip drivers (OCDs) 160 receives data from the data control module 120 and drives data (DQ) off the chip in accordance with a data enable signal (DQEN) from the data enable module 130. A data strobe OCD (DQS OCD) 162 receives a data strobe signal (DATA STROBE) from the strobe generator 150 and drives a data strobe signal (DQS) off the chip in accordance with a data strobe enable signal (DQSEN) received from the data strobe enable module 140.

Data control module 120 represents circuitry operable to time and control data flow through data OCDs 160 to the system. Data enable module 130 represents circuitry that enables, via a signal DQEN, data OCDs 160 when data is being driven off the chip in a read burst operation. At other times (i.e., when a read burst is not occurring), the DQEN signal from data enable module 130 forces the outputs of data OCDs 160 to tristate, thus preventing contamination of the system.

Control of the DQS OCD 162 is somewhat analogous to that of the data OCDs 160. In particular, data strobe enable module 140 represents circuitry that enables DQS OCD 162 using a signal DQSEN, and strobe generator module 150 represents circuitry for controlling and timing the strobe generation to provide a timing reference for the data driven off the chip by data OCDs 160. More specifically, strobe generator 150 supplies a signal DATASTROBE to DQS OCD 162, which is essentially a version of an external or local clock that is synchronized with the timing of the data being supplied to data OCDs 160. When enabled by the DQSEN signal during a read operation, DQS OCD 162 drives the data strobe signal off the chip as the DQS signal. Accordingly, DQ comprises data information that is clocked off the chip, and DQS comprises a strobe signal which corresponds in time to the data being clocked off the chip. Rising and falling edges of the DQS signal can be used by another device in the system to latch the data DQ.

Figure 2:
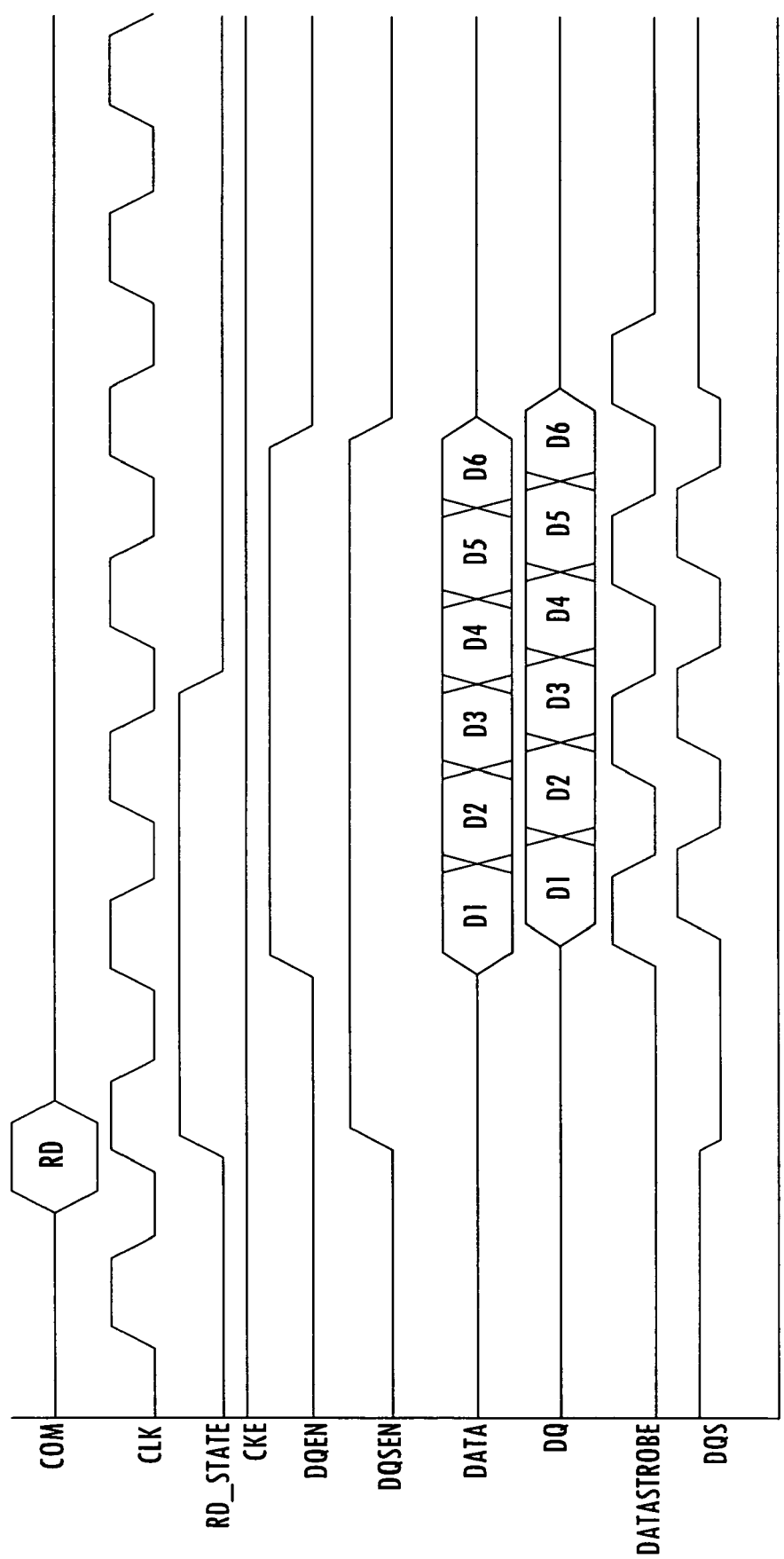
FIG. 2 is a timing diagram illustrating a normal read burst operation in the DDR SDRAM of FIG. 1, without an illegal power down command being received.

FIG. 2 depicts a timing diagram illustrating a normal read burst operation in DDR SDRAM 100 of FIG. 1 without an interruption, i.e., no power down instruction is received from the system during the read burst operation. An external command signal (COM) received by central control module 110 instructs the DDR SDRAM 100 to perform a read burst operation. A clock signal (CLK) is supplied to central control module 110 as well as other modules in DDR SDRAM 100 to provide a timing reference. While shown for simplicity as a single clock in the drawing figures, in typical memory device chips, there may be a number of distinct clock signals, including an external clock signal VCLK and one or more local clocks derived from the external clock, which may be offset relative to the external clock. A clock enable (CKE) signal can be used to command DDR SDRAM 100 to power down. The CKE signal shown in FIG. 2 remains in a high state throughout the read burst operation, since, in this example, a read burst is completed without occurrence of a power down operation.

In response to receiving the read burst command, central control module 110 sends a read state command (RD_STATE) to a high state with the rising edge of the clock signal CLK, indicating a read burst. The read state signal is supplied to data control module 120, data enable module 130, data strobe enable module 140, and strobe generator module 150. Read address information (not shown) concurrently supplied to DDR SDRAM 110 along with the read burst command RD is used to retrieve a sequence of memory words from the memory core of the DDR SDRAM. Data control module 120 receives the sequence of data words and supplies the data to data OCDs 160, with each data OCD 160 being responsible for driving an individual bit of each data word off the chip. Specifically, upon receiving a "high" read state signal, at the next rising edge of the CLK signal, data control module 120 begins sending a sequence of data words (DATA) D1, D2, D3, etc. to the data OCDs 160. Likewise, upon receiving the high read state signal, data enable module 130 sends the DQ enable signal (DQEN) to a high state at the next rising edge of CLK, which is supplied to data OCDs 160 such that the data words DQ (D1, D2, etc.) are driven off the DDR SDRAM 100 by the data OCDs in half-clock-cycle increments. The delay between the DATA signal (D1, D2, etc.) and the DQ signal (D1, D2, etc.) shown in FIG. 2 is due to propagation delays through the data OCDs 160.

Consistent with the timing of the data control module 120 and data enable module 130, upon receiving the high read state signal, strobe generator module 150 generates a data strobe signal (DATASTROBE) at the next rising edge of the CLK signal. The data strobe signal remains in the low state other than during a read burst operation and is essentially a replica of the CLK signal during the read burst operation, oscillating between first and second states. DQS OCD 162 receives the data strobe signal from strobe generator module 150 and generates the DQS signal from the data strobe signal while the DQSEN signal is high. The delay between the data strobe signal and the DQS signal shown in FIG. 2 is due to propagation delay through DQS OCD 162.

In contrast to the other modules, data strobe enable module 140 immediately sends the DQS enable signal (DQSEN) to a high state upon receiving the high read state signal (rather than at the next rising edge of CLK). Thus, the DQEN signal transitions to the high state and the data strobe signal begins to oscillate essentially one clock cycle after the DQSEN signal transitions to the high state. DQSEN is sent to a high state earlier so that the DQS OCD 162 is enabled and the DQS signal is already in the low state (rather than transitioning from the tristate) when the strobe signal begins in order to provide a clean transition from the low state to the high state on the initial rising edge of the strobe signal, thereby ensuring that the strobe signal DQS can provide proper latching for the first data word driven off the chip in the read burst.

After a predetermined time, central control module 110 sends the read state signal back to the low state, consistent with the duration of the read burst. In the example shown in FIG. 2, the read state signal returns to the low state after three clock cycles in which a total of six words are read from the DDR SDRAM in accordance with three rising clock signal edges and three falling clock signal edges. In response to the read state signal returning to the low state, the data enable module 130 and data strobe enable module 140 respectively send the DQEN and DQSEN signals to the low state, thereby respectively disabling the data OCDs 160 and DQS OCD 162 and concluding the read burst operation (the vertically-centered horizontal lines shown for the DQ and DQS signals in FIG. 2 represent the tristate).

Figure 3:
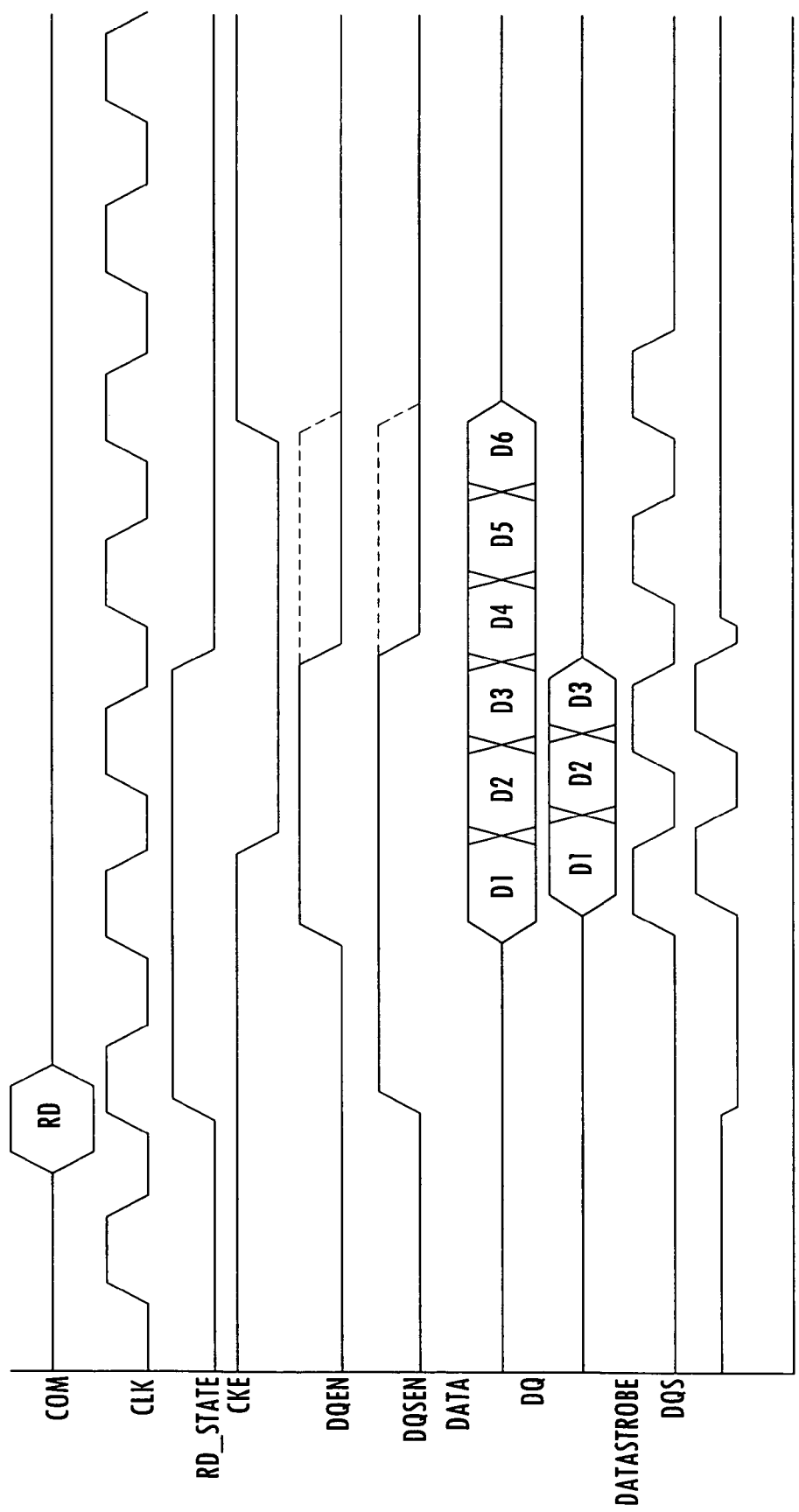
FIG. 3 is a timing diagram illustrating implementation of a power down during a read burst operation in the DDR SDRAM of FIG. 1.

FIG. 3 depicts a timing diagram illustrating an illegal power down in DDR SDRAM 100 of FIG. 1 during a read burst operation. The various signals shown in FIG. 3 correspond to those shown in FIG. 2. However, in this case, the external clock enable signal (CKE) received by DDR SDRAM 100 is driven from a normally high state to a low state, thereby instructing the DDR SDRAM 100 to enter a power down state. As shown in FIG. 3, the CKE signal illegally interrupts the read burst operation after only two cycles of the read burst have been completed.

On the next falling edge of the CLK signal, central control module sends the read state signal to a low state which causes data enable module 130 and data strobe enable module 140 to prematurely send the DQEN and DQSEN signal to a low state, respectively (the full durations of the high state of the DQEN and DQSEN signals in a normal read burst are shown in dashed lines in FIG. 3). Truncation of the DQEN and DQSEN signals results in only two data words (D1 and D2) being fully driven off the chip before the read burst is interrupted.

According to the conventional screening technique used in this example, the DQEN and DQSEN signals are reset to low to disable all OCDs and avoid system contamination. In other words, the remaining data and its corresponding strobing information are not driven onto external lines to prevent the data and strobe from mingling with other data on the lines. To ensure that DQS is not "stuck at high" or in the middle of a signal transition, the reset of the DQEN and DQSEN signals is performed with a signal that is derived from the CKE signal by delaying that signal until the CLK signal is low. This ensures that DQS is driving a low state when the OCDs are disabled. To ensure that logic of the DDR SDRAM is not affected by the illegal power down, the read burst is allowed to finish internally before entering the power down state, as indicated by the presence of all six data words (D1 through D6) for the DATA signal in FIG. 3.

Figure 4:
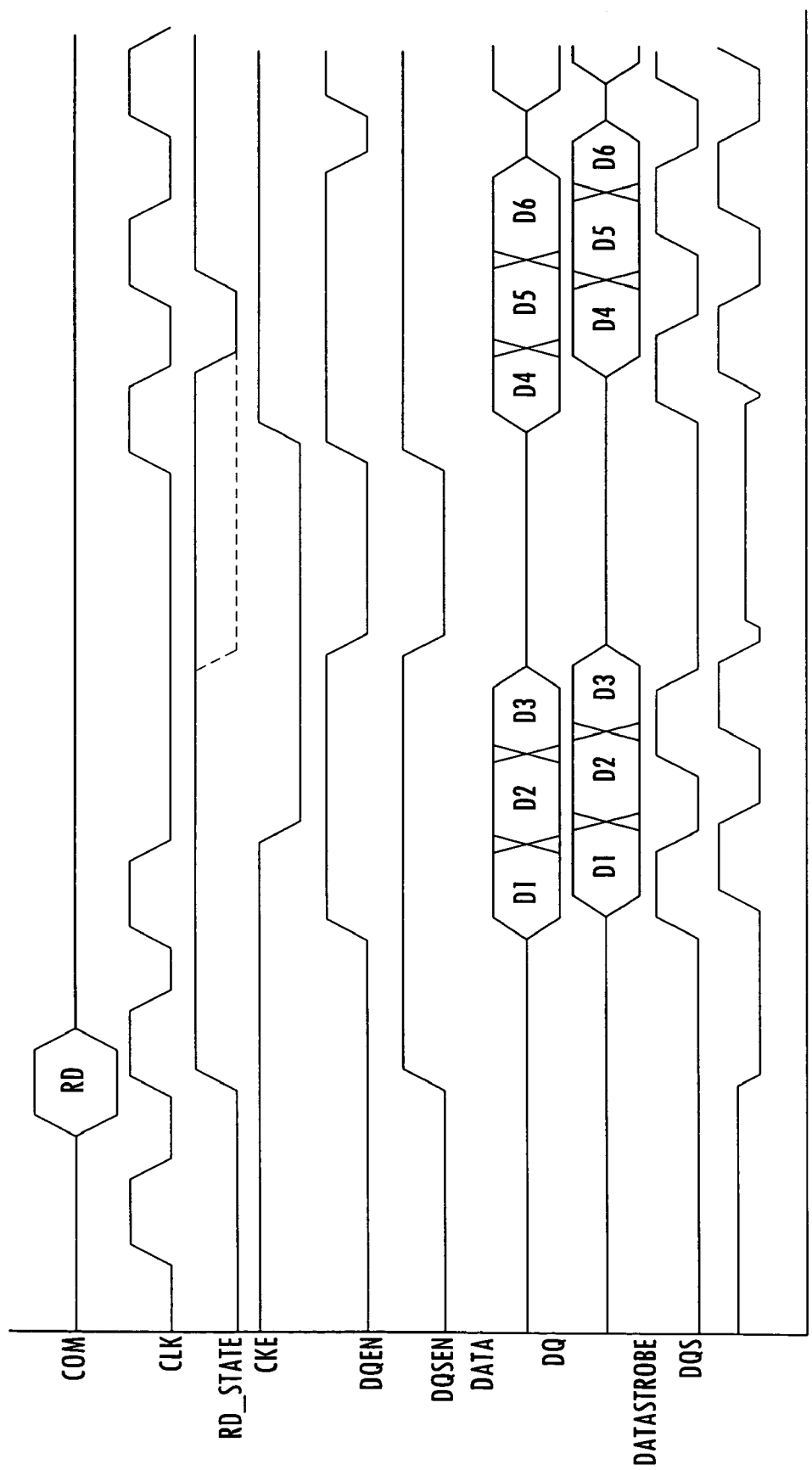
FIG. 4 is a timing diagram illustrating implementation of a power down during a read burst operation in the DDR SDRAM of FIG. 1, wherein the power down operation includes suspension of the clock.

Specialty DDR SDRAMs, such as mobile DDR SDRAMs, have an additional power features that permit the DDR SDRAM to operate with lower power consumption. One of these features allows the system to cut off the external clock (VCLK) to the DDR SDRAM during the power down state to conserve additional power. FIG. 4 depicts a timing diagram illustrating an illegal power down in the DDR SDRAM 100 of FIG. 1 during a read burst operation, where the clock is stopped during the power down state. Note that, unlike the time diagram of FIG. 3, in FIG. 4, the CLK signal stops oscillating and remains in a low state while the CKE signal (i.e., the power down command) remains in a low state. By cutting off the external clock VCLK, all internal clocks also stop running, since they are derived from VCLK. Because the clock signal supplied to central control module 110 is suspended, the read state signal (RD_STATE) remains in the high state (active) during the power down state. That is, central control module 110 cannot send the read state signal back to an inactive state after the predetermined number of clock cycles, since there is no clock. As indicated by the "CLK_LO" block shown in FIG. 1, which sends a reset signal to data enable module 130 and data strobe enable module 140, the DQEN and DQSEN signals are reset to low during power down in response to the CKE signal; however, the read burst does not finished internally (note the difference between the DATA line shown in FIG. 3 where only three words are supplied by data control module 120 and the DATA line shown in FIG. 2 where all six data words are supplied).

At the conclusion of the power down state, the system clock starts running again and the internal read burst continues, since the read state signal remains active. If the power down state is exited at the same time that the DQEN and DQSEN signals are activating the OCDs, the system is contaminated with unexpected DQ and DQS signals, as indicated by data words D4, D5, D6, and the corresponding DQS signal in FIG. 4. Referring again to FIG. 3, this same system contamination problem can occur without a clock stop if the power down state is exited before the remaining internal read burst has finished (e.g., if the CKE signal goes to a high state before all six of the internal DATA words D1–D6 are read).

Figure 5:
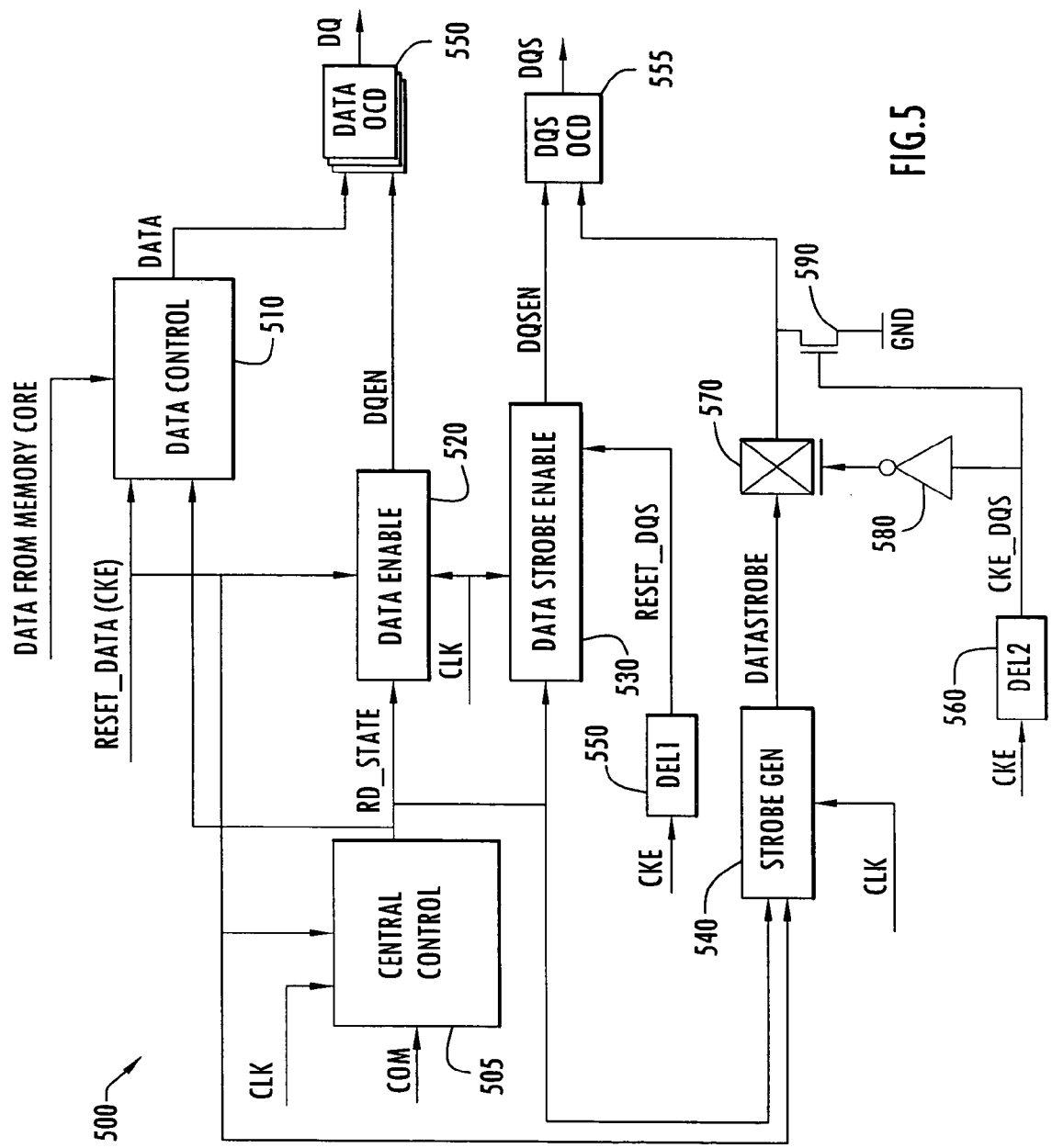
FIG. 5 is a block diagram of the read output section of a DDR SDRAM according to an exemplary embodiment of the present invention.

A block diagram of a DDR SDRAM architecture 500 for implementing a power down, read disable scheme in accordance with an exemplary embodiment of the present invention is shown in FIG. 5. The architecture depicted in FIG. 5 is a conceptual diagram illustrating major functional units, and does not necessarily illustrate physical relationships. Memory device 500 can be, for example, a dynamic random access memory (DRAM), such as a double data rate (DDR) synchronous DRAM (SDRAM), or a reduced latency DRAM (RLDRAM). However, it will be understood that the invention is not limited to a particular type of memory device or the specific architecture shown in FIG. 5, and the invention is applicable to virtually any type of memory device in which power down schemes or burst mode operations are implemented.

Included in memory device 500 are a number of modules and signals whose functions are generally similar to comparable modules and signals in memory device 100 shown in FIG. 1, with a number of important differences. Specifically, memory device 500 includes a central control module 505 which receives the external command signal (COM) and clock signal (CLK). Central control module 505 supplies the read state signal (RD_STATE) to a data control module 510, a data enable module 520, a data strobe enable module 530, and a strobe generator block 540. A set of off-chip drivers (OCDs) 550 receives data from data control module 510 and drives data (DQ) off the chip in accordance with a data enable signal (DQEN) from data enable module 520. A data strobe OCD (DQS OCD) 555 receives a data strobe signal (DATA STROBE) from strobe generator 540 and drives a data strobe signal (DQS) off the chip in accordance with a data strobe enable signal (DQSEN) received from the data strobe enable module 530.

Data control module 510 represents circuitry operable to time and control data flow through data OCDs 550 to the system. Data enable module 520 represents circuitry that enables data OCDs 550 via a signal DQEN when data is being driven off the chip in a read burst operation. At other times (i.e., when a read burst is not occurring), the DQEN signal from data enable module 520 forces the outputs of data OCDs 550 to tristate, thus preventing system contamination. Data strobe enable module 530 represents circuitry that enables DQS OCD 555 using a signal DQSEN, and strobe generator module 540 represents circuitry for controlling and timing the strobe generation to provide a timing reference for the data driven of the chip by data OCDs 550. Strobe generator module 540 supplies a data strobe signal (DATA STROBE) to DQS OCD 555. As previously noted, the data strobe signal is essentially a version of an external or local clock that is synchronized with the timing of the data being supplied to data OCDs 540. As used herein, the term data strobe signal refers to any timing signal or clock-like signal that oscillates between states in accordance with the timing of data being driven off a memory device. When enabled by the DQSEN signal during a read operation, DQS OCD 555 drives the data strobe signal off the chip as the DQS signal.

While a single DQS OCD and a single strobe signal DQS are shown in FIG. 5, it will be understood that more than one DQS strobe signal may be driven off the chip via respective OCDs. For example, a typical memory device might provide one strobe signal for every eight bits of data being driven off the device during a read operation, such that a memory device reading out sixteen-bit words would drive two strobe signals off the chip with the sixteen bits, with each strobe signal corresponding to a set of eight bits. The invention is not limited to data words having any particular number of bits and is not limited to any particular number of strobe signals or number of data bits per strobe signal.

Central control module 505, data control module 510, data enable module 520, and strobe generator module 540 all receive a reset data signal, which can be the clock enable signal (CKE) or a signal derived from the CKE signal. Data strobe enable module 530 receives a reset DQS signal (RESET_DQS), which is essentially a delayed version of the CKE signal. Specifically, a delay of a specific duration (delay1) is applied to the CKE signal to produce the reset DQS signal, as indicated by the block DEL1 550 shown in FIG. 5.

A transfer gate 570 is disposed in the signal path of the data strobe signal between the strobe generator 540 and DQS OCD 555. Transfer gate 570 selectively blocks or passes the data strobe signal in accordance with a signal CKE_DQS. The CKE_DQS signal is essentially a delayed version of the CKE signal generated by applying a delay of a specific duration (delay2) to the CKE signal, as indicated by the block DEL2 560 shown in FIG. 5. As explained in greater detail below, the duration of delay2 is less than the duration of delay1. The CKE_DQS signal is supplied to transfer gate 570 via an inverter 580 due to the polarity of the CKE signal. The CKE_DQS signal is also supplied to the gate of an NFET transistor 590 which has one node connected to ground and the other node connected to the signal path of the data strobe signal between transfer gate 570 and DQS OCD 555. When the CKE signal is driven low to command a power down, after a delay (delay2), the CKE_DQS signal disables transfer gate 570 to block the data strobe signal and pulls the data strobe line to a low state by turning on transistor 590 and forcing the data strobe signal line to ground. The delays delay1 and delay2 respectively represented by blocks DEL1 550 and DEL2 560 can be implemented in any of a variety ways, including hardware (e.g., a delay element), software, or a combination of hardware and software.

Operation of memory device 500 during an illegal power down that occurs during a read burst operation is described in connection with the timing diagram shown in FIG. 6. Note that the power down shown in timing diagram in FIG. 6 includes suspension of the clock (CLK), i.e., a clock stop. It will be appreciated, however, that the power down scheme of the present invention is equally applicable to systems where the power down does not include a clock stop feature.

An external command signal (COM) received by central control module 505 instructs memory device 500 to perform a read burst operation. The command signal COM can be, for example, a set of bits whose values encode a set of commands (read, write, etc.). Central control module 505 receives the bits of the command signal and determines what operation is to be performed by memory device 500, in this case, the read command (RD). A clock signal (CLK) is supplied to central control module 505 as well as other modules in memory device 500 to provide a timing reference. As previously noted with respect to memory device 100 in FIG. 1, the CLK signal can actually be a number of distinct clock signals including an external clock VCLK and other internal clock signals derived therefrom.

A normal read burst operation (one not interrupted by an illegal power down) in memory device 500 is performed in essentially the same manner as in memory device 100 of FIG. 1 (see, e.g., the timing diagram of FIG. 2). Specifically, in response to receiving the read burst command, central control module 505 sends the read state command (RD_STATE) to a high state with the rising edge of the clock signal CLK, indicating a read burst. The read state signal is supplied to data control module 510, data enable module 520, data strobe enable module 530, and strobe generator module 540. Data control module 510 receives the sequence of data words and supplies the data to data OCDs 550, with each data OCD 550 being responsible for driving an individual bit of each data word off the chip. Likewise, upon receiving the high read state signal, data enable module 520 sends the DQ enable signal (DQEN) to a high state at the next rising edge of CLK, which is supplied to data OCDs 550 such that the data words DQ (D1, D2, etc.) are driven off memory chip 500 by the data OCDs in half-clock-cycle increments.

Upon receiving the high read state signal, strobe generator module 540 generates the data strobe signal at the next rising edge of the CLK signal. DQS OCD 555 receives the data strobe signal from strobe generator module 540 and generates the DQS signal from the data strobe signal while the DQSEN signal is high. Data strobe enable module 140 immediately sends the DQS enable signal (DQSEN) to a high state upon receiving the high read state signal; thus, the data strobe signal begins to oscillate essentially one clock cycle after the DQSEN signal transitions to ensure that the strobe signal DQS can provide proper latching for the first data word driven off the chip in the read burst, as described above.

Figure 6:
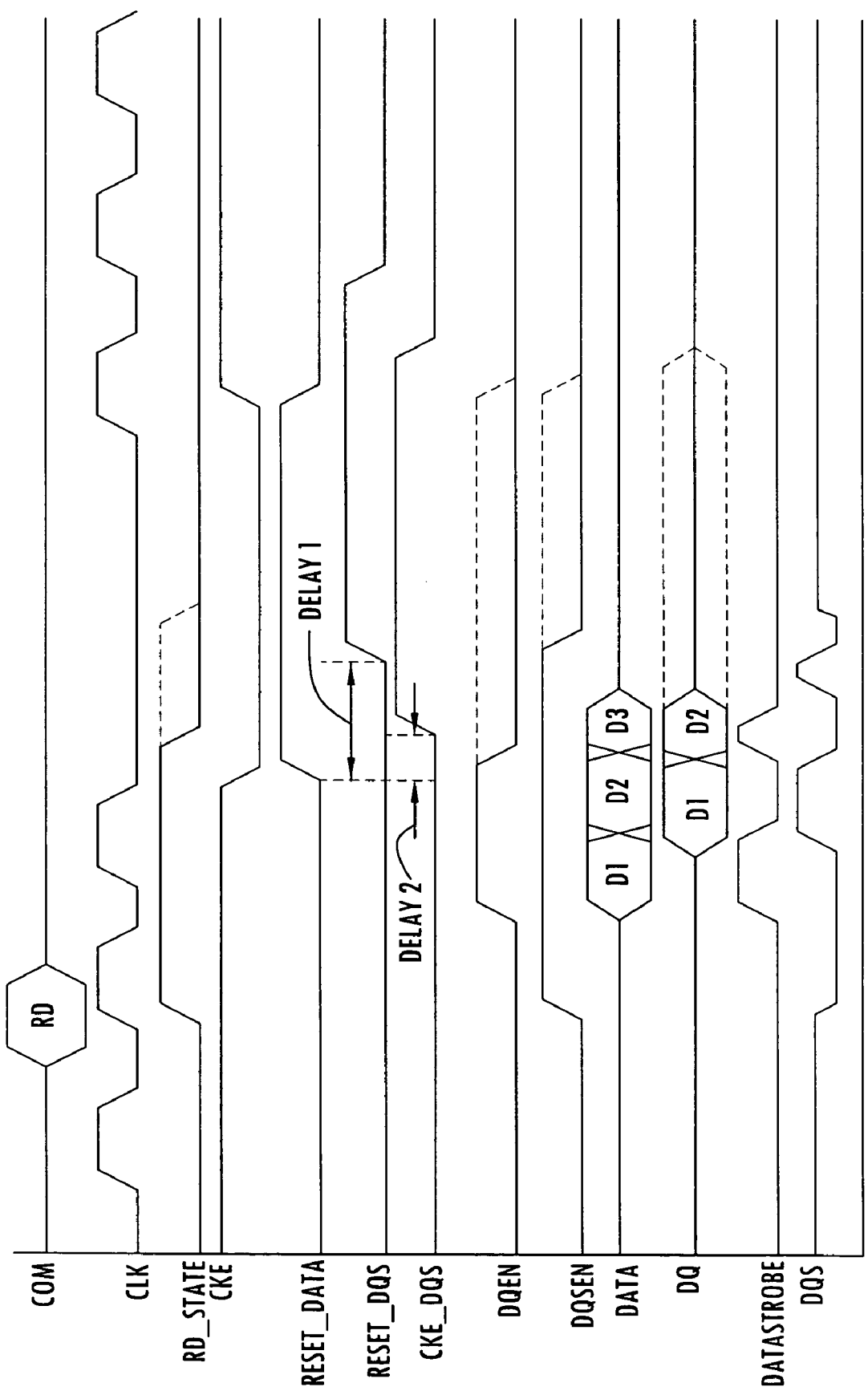
FIG. 6 is a timing diagram illustrating implementation of a power down operation in the DDR SDRAM of FIG. 5.

Referring still to FIG. 6, memory device 500 is commanded to perform a power down operation via the external clock enable (CKE) signal being driven to a low state. In this case, an illegal power down is commanded, since the CKE is sent to the low state during a read burst operation. In addition, the CLK signal supplied to memory device 500 is suspended (i.e., stops oscillating and remains in a low state) during the power down. While particular signal polarities are used in FIG. 6 to describe the invention (e.g., "high" and "low" states), it will be appreciated that the invention is not limited to the use of signals of any particular polarity or any particular correspondence between states of certain signal and certain functions. For example, while a CKE signal in a "low" logical state is conventionally associated with a power down operation, the invention would work equally well with an opposite polarity convention. Likewise, certain signals described as being triggered on rising edges of clock signals could be triggered on falling edges and vice versa.

According to an important aspect of the invention, a series of reset or disable signals is generated in response to the power down (CKE) signal, which causes any ongoing read burst operation to be terminated via sequentially timed steps that prevent malfunctions from occurring. In the exemplary embodiment shown in FIGS. 5 and 6, in response to the CKE signal transitioning from a high state to a low state to command a power down, the reset data signal (RESET_DATA) signal transitions from a low state to a high state. In this example, the reset data signal is essentially the same as the CKE signal but with an opposite polarity. The reset data signal, in principle, could be generated from the CKE signal using an inverter, or the CKE signal could be supplied directly to the various modules provided the signal polarity is compatible with the modules receiving the signal. It will be appreciated that, if the reset data operation is to be triggered by other events in addition to a power down, the reset data signal can be generated from the CKE signal and other relevant signals using more complex logic.

The reset data signal essentially resets central control module 505, data control module 510, data enable module 520, and strobe generator module 540. Receipt of the reset data signal ensures that during the power down (i.e., while CKE is low), no data is driven to the data OCDs 550, the data OCDs 550 are disabled, the read state is exited, and no data strobe signals are generated. Specifically, in response to receiving a low read state signal, central control module 505 prematurely drives the read state signal to low, data control module 510 stops supplying data to the data OCDs 550, data enable module 520 prematurely drives the DQEN signal to low to disable the data OCDs 550 and to prevent data DQ from being driven off the chip, and strobe generator module 540 discontinues the strobe signal. For comparison, the durations of the "high" state for the read state signal, the DQEN signal, and the data DQ for a normal, uninterrupted read burst operation are shown in dashed lines in FIG. 6. Further, all logic and especially the input and output pointers for FIFO structures in data control module 510 are reset to prevent misalignment of those pointers.

The CKE_DQS signal supplied to transfer gate 570 (via inverter 580) and to transistor 590 is essentially an inverted, delayed version of the CKE signal generated by applying a predetermined delay of duration "delay2" (see FIG. 6) to the CKE signal via block DEL2 560. As used herein, the term "delayed version" refers to any delayed representation of signal, irrespective of the polarity of the delayed version of the signal. When the CKE_DQS signal is driven to the high state, the data strobe signal from strobe generator 540 is disconnected from DQS OCD 555 via transfer gate 570.

Substantially simultaneously, the high state of the CKE_DQS signal is applied to the gate of pull down NFET transistor 590, thereby activating the transistor and pulling the data strobe signal line between DQS OCD 555 and transfer gate 570 (i.e., the line that normal supplies the data strobe signal to DQS OCD 555) to ground, which in this example is a logical low state. This action guarantees that the data strobe signal line will be in a low state when the DQS OCD is subsequently disabled. The duration of delay2 is longer than the transition delay of the reset data signal described above, including any propagation delay through strobe generator module 540. This delay ensures that the data strobe signal is in a low state before transfer gate 470 disconnects the data strobe signal, which in turn prevents the possibility of the DQS signal being stuck at high or in a transition state, thereby avoiding malfunctions. While the implementation shown in FIG. 5 employs a transfer gate and pull down transistor arrangement to ensure the data strobe signal line is forced to a low state, it will be understood that other implementations could be used to accomplish this condition, and the invention is not limited to this particular example. The important principle is the that strobe signal is driven to a predetermined state (in this example, the low state) prior to the DQS OCD being disabled.

The RESET_DQS signal supplied to data strobe enable module 530 is essentially an inverted, delayed version of the CKE signal generated by applying a predetermined delay of duration "delay1" (see FIG. 6) to the CKE signal via block DEL1 550. Data strobe enable module 530 is reset by the RESET_DQS signal, causing the DQSEN signal to go to a low state and thereby disabling DQS OCD 555. Delay1, which is longer than delay2, is sufficiently long to delay the disabling of DQS OCD 555 until after the transition time of strobe generator module 540 (which is reset by the reset data signal), and the transition times of transfer gate 570 DQS_OCD 555 (through which the strobe signal propagates) in order to ensure that the strobe signal is in a low state prior to disabling DQS_OCD 555.

Figure 7:
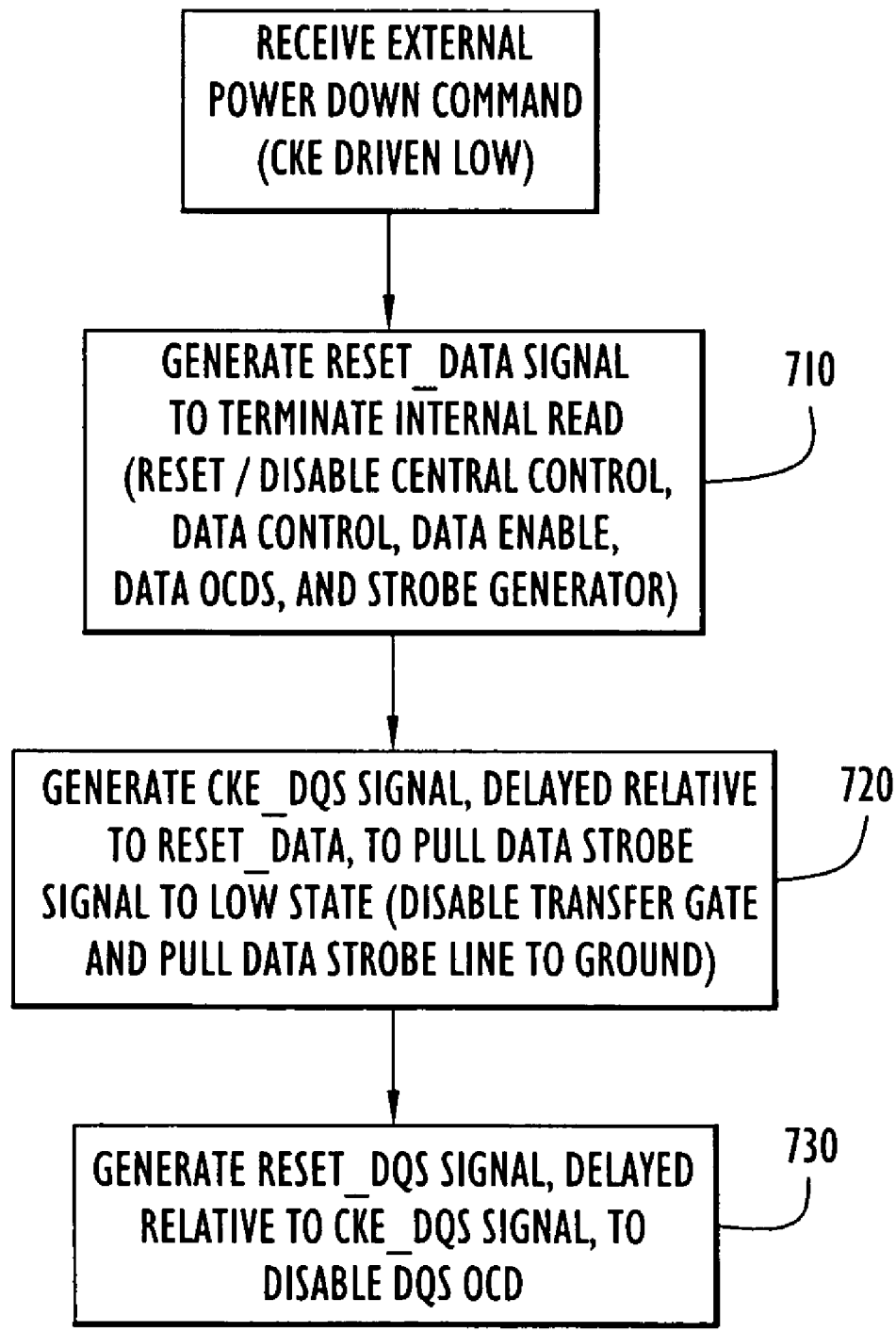
FIG. 7 is a functional flow diagram illustrating the operations performed to implement a power down operation in accordance with an exemplary embodiment of the present invention.

The operations performed to implement a power down capable of terminating an ongoing read burst are summarized in the flow diagram of FIG. 7. In response to the CKE signal going to a low state (to command a power down) any ongoing read burst is terminated using three successive resetting signals: RESET_DATA, CKE_DQS, and RESET_DQS. First, in operation 700, the RESET_DATA signal terminates the internal read by resetting/disabling the central control module, the data control module, the data enable module, the data OCDs, and the strobe generator module. Next, in operation 710, the CKE_DQS signal pulls the data strobe signal to a low state by disabling the transfer gate and pulling the strobe signal line to a low state via activation of the pull down transistor. Finally, in operation 720, after sufficient time has elapsed to ensure that the DQS OCD is driving a low signal in place of the data strobe signal, the DQS OCD is disabled with the RESET_DQS signal. This implementation also prevents system contamination during short power down states.

As will be appreciated from the foregoing, an important aspect of the present invention is the termination of a read burst operation in stages within a memory device, such as a DDR SDRAM, when an illegal power down is commanded. In a first stage, the DRAM internal read state is terminated and the data OCDs are disabled in response to the CKE signal being driven to a predetermined state (e.g., a low state). In a second stage, the data strobe signal is pulled to a predetermined state (e.g., a low state) using a delayed version of the CKE signal, wherein the delay longer than the time required to complete the termination in the first stage. In a third stage, a further delayed version of the CKE signal is used to disable the DQS OCD that drives the data stobe signal off the DRAM chip. This further delayed version of the CKE signal is delayed sufficiently long to ensure that the termination of the second stage is completed, thereby guaranteeing that the data strobe signal is in the predetermined state prior to disabling the DQS OCD. Using delayed versions of the CKE signal transitioning to the low state ensures an asynchronous power down entry and therefore is suitable for power down state that feature clock stop options.

In the timing diagram shown in FIG. 6, the example illustrates how, upon receiving a power down command, an ongoing read burst operation is terminated in stages. It will be appreciated that not all power down commands received by the memory device will occur during an ongoing read burst operation (i.e., most power downs will be legal power downs not commanded during read bursts). In accordance with one option, the memory device may generate the necessary commands to terminate a read burst operation irrespective of whether a read burst operation is actually ongoing. In this case, the various modules and OCDs associated with reading data from the memory device will be reset and disabled during each power down regardless of whether a read burst is ongoing. This approach is simple in that all power downs are implemented in the same manner without having to consider whether a read burst is occurring, and the reset/disable operations are performed regardless of whether they are actually necessary for a particular power down. Another option is to perform the multi-stage read burst termination scheme upon power down only when a read burst operation is ongoing, and to perform a simplified power down scheme at other times. This approach would require determining upon receipt of each power down command whether a read burst operation is ongoing.

While a technique for terminating a read burst operation has been described in the context of performing a power down illegally commanded during an ongoing read burst operation, it will be appreciated that the operations described herein could be used to prematurely terminate a read burst operation under any of a variety of other operating conditions, and the read burst termination technique is not necessarily limited to a power down situation. For example, the sequential reset commands described herein could be used to terminate a read burst operation in response to a loss of power, a loss of certain external signals, or certain types of interrupt commands, if advantageous within the architecture of a particular memory device.

Having described preferred embodiments of new and improved method and apparatus for implementing a power down in a memory device, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method of implementing a power down in a memory device capable of performing a read operation in which outputs of the memory device include data and a data strobe signal that oscillates between first and second states during the read operation in accordance with a timing of the data, the method comprising:

generating a first signal for preventing the data from being supplied as an output of the memory device;

generating a second signal for causing the data strobe signal to remain in a predetermined state; and generating a third signal for preventing the data strobe signal in the predetermined state from being supplied as an output of the memory device.

2. The method of claim 1, wherein the second signal is delayed relative to the first signal.

3. The method of claim 1, wherein the third signal is delayed relative to the second signal such that the data strobe signal is in the predetermined state when the third signal is generated.

4. The method of claim 1, wherein the first, second, and third signals are generated in response to a power down command signal.

5. The method of claim 4, wherein at least the second and third signals are delayed versions of the power down command signal.

6. The method of claim 1, wherein an external clock signal supplied to the memory device is suspended during power down.

7. A method of implementing a power down in a memory device capable of performing a read operation in which outputs of the memory device include data and a data strobe signal that oscillates between first and second states during the read operation in accordance with a timing of the data, the method comprising:

generating a first signal for preventing the data from being supplied as an output of the memory device;

generating a second signal for causing the data strobe signal to remain in a predetermined state; and generating a third signal for preventing the data strobe signal in the predetermined state from being supplied as an output of the memory device;

wherein the first, second, and third signals terminate a read burst operation in stages.

8. The method of claim 7, wherein the second signal is delayed relative to the first signal, and wherein the third signal is delayed relative to the second signal such that the data strobe signal is in the predetermined state when the third signal is generated.

9. A method for terminating a read burst operation in a memory device, wherein outputs of the memory device include data and a data strobe signal that oscillates between first and second states during the read burst operation in accordance with a timing of the data, the method comprising:

(a) disabling an operation of supplying the data as an output of the memory device;

(b) causing the data strobe signal to remain in a predetermined state; and (c) disabling an operation of supplying the data strobe signal in the predetermined state as an output of the memory device.

10. The method of claim 9, wherein (b) is delayed until completion of (a), and (c) is delayed until completion of (b).

11. The method of claim 9, wherein (a), (b), and (c) are performed in response to a power down command signal.

12. The method of claim 9, wherein (a), (b), and (c) are performed while an external clock signal supplied to the memory device is suspended.

13. The method of claim 9, wherein (a) includes disabling a plurality of data off-chip drivers that provide the data as an output of the memory device.

14. The method of claim 9, wherein (c) includes disabling at least one data strobe off-chip driver that provides the data strobe signal as an output of the memory device.

15. A memory device capable of implementing a power down operation and capable of performing a read operation in which outputs of the memory device include data and a data strobe signal that oscillates between first and second states during the read operation in accordance with a timing of the data, the memory device comprising:

a plurality of data off-chip drivers operable to supply the data as an output of the memory device, wherein the data off-chip drivers are disabled in response to a power down command signal;

a strobe generator module operable to generate the data strobe signal, wherein the strobe generator module causes the data strobe signal to remain in a predetermined state in response to the power down command signal; and at least one data strobe off-chip driver operable to supply the data strobe signal as an output of the memory device, wherein, in response to the power down command signal, the at least one data strobe off-chip driver is disabled after the strobe generator module causes the data strobe signal to remain in the predetermined state.

16. The memory device of claim 15, wherein a connection for supplying the data strobe signal from the data strobe signal generator to the at least one data strobe off-chip driver is forced to the predetermined state in response to a reset signal delayed by a predetermined delay relative to the power down command signal.

17. The memory device of claim 16, wherein the reset signal is a delayed version of the power down command signal.

18. The memory device of claim 15, further comprising:

a connection for supplying the data strobe signal from the data strobe signal generator to the at least one data strobe off-chip driver, wherein the connection is forced to the predetermined state in response to a first reset signal delayed by a first predetermined delay relative to the power down command; and a data strobe enable module operable to selectively enable and disable the at least one data strobe off-chip driver, wherein the data strobe enable module is reset in response to a second reset signal delayed by a second predetermined delay relative to the power down command, wherein the second predetermined delay is greater than the first predetermined delay.

19. The memory device of claim 15, wherein the memory device is a dynamic random access memory (DRAM) device.

20. The memory device of claim 19, wherein the DRAM is a double data rate (DDR) synchronous DRAM (SDRAM).

21. A memory device capable of implementing a power down operation and capable of performing a read operation in which outputs of the memory device include data and a data strobe signal that oscillates between first and second states during the read operation in accordance with a timing of the data, the memory device comprising:

a plurality of data off-chip drivers operable to supply the data as an output of the memory device, wherein the data off-chip drivers are disabled in response to a power down command signal;

a strobe generator module operable to generate the data strobe signal, wherein the strobe generator module causes the data strobe signal to remain in a predetermined state in response to the power down command signal;

at least one data strobe off-chip driver operable to supply the data strobe signal as an output of the memory device, wherein, in response to the power down command signal, the at least one data strobe off-chip driver is disabled after the strobe generator module causes the data strobe signal to remain in the predetermined state;

a data control module operable to supply the data to the plurality of data off-chip drivers; and a data enable module operable to selectively enable and disable the plurality of data off-chip drivers;

wherein the data control module and data enable module are reset in response to the power down command signal.

22. A memory device capable of implementing a power down operation and capable of performing a read operation in which outputs of the memory device include data and a data strobe signal that oscillates between first and second states during the read operation in accordance with a timing of the data, the memory device comprising:

a plurality of data off-chip drivers operable to supply the data as an output of the memory device, wherein the data off-chip drivers are disabled in response to a power down command signal;

a strobe generator module operable to generate the data strobe signal, wherein the strobe generator module causes the data strobe signal to remain in a predetermined state in response to the power down command signal;

at least one data strobe off-chip driver operable to supply the data strobe signal as an output of the memory device, wherein, in response to the power down command signal, the at least one data strobe off-chip driver is disabled after the strobe generator module causes the data strobe signal to remain in the predetermined state; and a data strobe enable module operable to selectively enable and disable the at least one data strobe off-chip driver, wherein the data strobe enable module is reset in response to a reset signal delayed by a predetermined delay relative to the power down command.

23. The memory device of claim 22, wherein the reset signal is a delayed version of the power down command signal.

24. A memory device capable of implementing a power down operation and capable of performing a read operation in which outputs of the memory device include data and a data strobe signal that oscillates between first and second states during the read operation in accordance with a timing of the data, the memory device comprising:

means for supplying the data as an output of the memory device, wherein the means for supplying the data is disabled in response to a power down command;

means for generating the data strobe signal, wherein the means for generating the data strobe signal causes the data strobe signal to remain in a predetermined state in response to the power down command; and means for supplying the data strobe signal as an output of the memory device, wherein, in response to the power down command, the means for supplying the data strobe signal is disabled after the means for generating the data strobe signal causes the data strobe signal to remain in the predetermined state.

25. The memory device of claim 24, wherein the memory device is a dynamic random access memory (DRAM) device.

26. The memory device of claim 25, wherein the DRAM is a double data rate (DDR) synchronous DRAM (SDRAM).

* * * * *